United States Patent
Srivastava et al.

(10) Patent No.: US 6,466,135 B1
(45) Date of Patent: Oct. 15, 2002

(54) PHOSPHORS FOR DOWN CONVERTING ULTRAVIOLET LIGHT OF LEDS TO BLUE-GREEN LIGHT

(75) Inventors: Alok Mani Srivastava, Niskayuna; Thomas Francis McNulty, Ballston Lake; Holly Ann Comanzo, Niskayuna, all of NY (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 09/571,383

(22) Filed: May 15, 2000

(51) Int. Cl.$^7$ .............................. G08B 5/00; H01L 33/00
(52) U.S. Cl. .............. 340/815.4; 340/907; 340/815.45; 362/230; 362/293; 362/800; 257/89; 345/44; 345/83; 428/690; 313/502; 313/486
(58) Field of Search .................. 340/815.4, 815.45, 340/525, 907, 908; 313/502–504, 485, 486; 362/800, 84, 230, 231, 293; 428/690, 919; 427/66; 257/89, 98, 102; 345/44–46, 82, 83, 76

(56) References Cited

U.S. PATENT DOCUMENTS

| 4,661,419 A | 4/1987 | Nakamura ................ 428/691 |
| 5,198,679 A | 3/1993 | Katoh et al. ............. 250/484.1 |
| 5,571,451 A | 11/1996 | Srivastava et al. ........ 252/301.4 |

(List continued on next page.)

FOREIGN PATENT DOCUMENTS

JP 183408 6/2000

OTHER PUBLICATIONS

Keith Butler: Fluorescent Lamp Phosphors, pp. 98–107 (The Pennsylvania State University Press 1980).

S. Nakamura et al.: The Blue Laser Diode, pp. 216–221, 328–329 (Springer 1997).

G. Blasse et al.: Luminescent Materials, pp. 109–110 (Springer–Verlag 1994).

Blasse et al: "Fluorescence of Eu$^{2+}$–Activated Alkaline-Earth Aluminates," Philips Res. Repts, 23, 201–206 (1968).

Blasse et al: "Fluorescence of Eu$^{2+}$–Activated Silicates," Philips Res. Repts, 23, 189–200 (1968).

S. Shionoya et al: "Phosphor Handbook," 168–170, 317–330, 343–349, 389–410, 412–417, 419–431, 555, 623–636 (1999).

*Primary Examiner*—Donnie L. Crosland
(74) *Attorney, Agent, or Firm*—Foley & Lardner

(57) ABSTRACT

There is provided a blue-green illumination system, comprising a light emitting diode, and at least one luminescent material having at least two peak emission wavelengths, wherein the emission CIE color coordinates of the at least two peak emission wavelengths are located within an area of a pentagon on a CIE chromaticity diagram, whose corners have the following CIE color coordinates:

e) x=0.0137 and y=0.4831;

b) x=0.2240 and y=0.3890;

c) x=0.2800 and y=0.4500;

g) x=0.2879 and y=0.5196; and h) x=0.0108 and y=0.7220.

The illumination system may be used as the green light of a traffic signal. The luminescent material may be a blend of $(Ba_{1-x}Eu_x)Mg_2Al_6O_{27}$ ("BAM") and $(Ba_{1-x}Eu_x)Mg_{2-y}Mn_yAl_{16}O_{27}$ ("BAMMn") phosphors, where $0<x\leq0.2$ and $0<y\leq0.5$.

43 Claims, 9 Drawing Sheets

U.S. PATENT DOCUMENTS

| | | | |
|---|---|---|---|
| 5,813,753 A | | 9/1998 | Vriens et al. ................ 362/293 |
| 5,814,416 A | * | 9/1998 | Dodabalapur et al. ...... 428/690 |
| 5,847,507 A | | 12/1998 | Butterworth et al. ........ 313/512 |
| 5,851,063 A | | 12/1998 | Doughty et al. ............ 362/231 |
| 5,925,897 A | | 7/1999 | Oberman ..................... 257/80 |
| 5,966,393 A | | 10/1999 | Hide et al. ..................... 372/23 |
| 5,998,925 A | | 12/1999 | Shimizu et al. ............. 313/503 |
| 6,066,861 A | | 5/2000 | Höhn et al. .................... 257/99 |
| 6,069,440 A | | 5/2000 | Shimizu et al. ............. 313/486 |
| 6,084,250 A | | 7/2000 | Jüstel et al. ................... 257/89 |
| 6,144,352 A | * | 11/2000 | Matsuda et al. ............... 345/83 |
| 6,153,971 A | * | 11/2000 | Shimizu et al. ............. 313/486 |
| 6,221,517 B1 | * | 4/2001 | Eida et al. ................... 428/690 |

* cited by examiner

FIG. 5

| | FIRST PHOSPHOR | | | | | | |
|---|---|---|---|---|---|---|---|
| Second Phosphor | BAM | SECA | BAM+ SECA | One or More Eu$^{2+}$ Activated Aluminates | BAM + Aluminates | SECA + Aluminates | BAM + SECA + Aluminates |
| BAMMn | Preferred | X | X | X | X | X | X |
| EO*AlO:Eu$^{2+}$, Mn$^{2+}$ | X | X | X | X | X | X | X |
| EAlO:Eu$^{2+}$, Mn$^{2+}$ | X | X | X | X | X | X | X |
| GAlO:Eu$^{2+}$, Mn$^{2+}$ | X | X | X | X | X | X | X |
| EO*AlO+EAlO | X | X | X | X | X | X | X |
| EO*AlO+GAlO | X | X | X | X | X | X | X |
| EAlO+GAlO | X | X | X | X | X | X | X |
| EO*AlO+EAlO+GAlO | X | X | X | X | X | X | X |
| BAMMn+EO*AlO | X | X | X | X | X | X | X |
| BAMMn+EAlO | X | X | X | X | X | X | X |
| BAMMn+GAlO | X | X | X | X | X | X | X |
| BAMMn+EO*AlO+EAlO | X | – | X | X | X | X | X |
| BAMMn+EO*AlO+GAlO | X | X | X | X | X | X | X |
| BAMMn+EAlO+GAlO | X | X | X | X | X | X | X |
| BAMMn+EO*AlO+EAlO+GAlO | X | X | X | X | X | X | X |

PHOSPHORS FOR DOWN CONVERTING ULTRAVIOLET LIGHT OF LEDS TO BLUE-GREEN LIGHT

BACKGROUND OF THE INVENTION

This invention relates generally to a blue-green light illumination system, and specifically to a ceramic phosphor blend for converting UV radiation emitted by a light emitting diode ("LED") to blue-green light.

Semiconductor light emitting diodes are semiconductor chips that are mounted in a package and which emit radiation in response to an applied voltage or current. These LEDs are used in a number of commercial applications such as automotive, display, safety/emergency and directed area lighting.

One important application of semiconductor LEDs is as a light source in a traffic light. Presently, a plurality of blue-green emitting LEDs containing III–V semiconductor layers, such as GaN, etc., are used as the green light of a traffic signal (also known as a traffic light).

Industry regulations often require traffic light colors to have very specific CIE color coordinates. For example, according to the Institute of Transportation Engineers (ITE), a green traffic light in the United States is typically required to have emission CIE color coordinates located within an area of a quadrilateral on a CIE chromaticity diagram, whose corners have the following color coordinates:

a) x=0.000 and y=0.506;

b) x=0.224 and y=0.389;

c) x=0.280 and y=0.450; and d) x=0.000 and y=0.730. The following CIE color coordinates are most preferred for green traffic light applications: x=0.1 and y=0.55.

Likewise, industry regulations require automotive display colors to have specific CIE color coordinates. According to the Society of Automotive Engineers (SAE), a green automotive display, such as a vehicle dashboard display, is typically required to have emission CIE color coordinates located within an area of a quadrilateral on a CIE chromaticity diagram, whose corners have the following color coordinates:

e) x=0.0137 and y=0.4831;

f) x=0.2094 and y=0.3953;

g) x=0.2879 and y=0.5196; and h) x=0.0108 and y=0.7220.

The color coordinates (also known as the chromaticity coordinates) and the CIE chromaticity diagram are explained in detail in several text books, such as on pages 98–107 of K. H. Butler, "Fluorescent Lamp Phosphors" (The Pennsylvania State University Press 1980) and on pages 109–110 of G. Blasse et al., "Luminescent Materials" (Springer-Verlag 1994), both incorporated herein by reference.

Presently, GaN based LEDs are designed to emit blue-green light with a peak wavelength of 505 nm, which has the desired CIE color coordinates of x=0.1 and y=0.55. Table I illustrates the optical properties of an LED having a $In_{1-x}Ga_xN$ active layer that was manufactured according to desired parameters.

TABLE I

| Color Coordinates | | Peak Emission Wavelength | Emission Peak Half Width | External Quantum Efficiency | Efficacy (lm/W) |
|---|---|---|---|---|---|
| x | y | | | | |
| 0.1 | 0.55 | 505 nm | 35 nm | 10% | 25 lm/W |

In Table I, external quantum efficiency refers to a ratio of a number of photons emitted per number of electrons injected into the LED.

However, these LEDs with the $In_{1-x}Ga_xN$ active layer suffer from the following disadvantage. Due to frequent deviations from desired parameters (i.e., manufacturing systematic variations), the LED peak emission wavelength deviates from 505 nm, and thus, its CIE color coordinates deviate from the desired x=0.1 and y=0.55 values. For example, the LED color output (e.g., spectral power distribution and peak emission wavelength) varies with the band gap width of the LED active layer. One source of deviation from the desired color coordinates is the variation in the In to Ga ratio during the deposition of the $In_{1-x}Ga_xN$ active layer, which results in an active layer whose band gap width deviates from the desired value. This ratio is difficult to control precisely during mass production of the LEDs, which leads to inconsistent color coordinates in a given batch of LEDs. Thus, the $In_{1-x}Ga_xN$ LEDs which are suitable for use in traffic lights have a lower production yield because a large number of such LEDs with unsuitable emission color coordinates have to be discarded. The present invention is directed to overcoming or at least reducing the problem set forth above.

BRIEF SUMMARY OF THE INVENTION

In accordance with one aspect of the present invention, there is provided a blue-green illumination system, comprising a light emitting diode, and at least one luminescent material having at least two peak emission wavelengths, wherein the emission CIE color coordinates of the at least two peak emission wavelengths are located within an area of a pentagon on a CIE chromaticity diagram, whose corners have the following CIE color coordinates:

e) x=0.0137 and y=0.4831;

b) x=0.2240 and y=0.3890;

c) x=0.2800 and y=0.4500;

g) x=0.2879 and y=0.5196; and h) x=0.0108 and y=0.7220.

In accordance with another aspect of the present invention, there is provided a traffic signal, comprising a housing, at least one lens, a radiation source having a peak emission wavelength of 420 nm and below, and at least one luminescent material having at least two peak emission wavelengths, wherein the emission CIE color coordinates of the at least two peak emission wavelengths are located within an area of a quadrilateral on a CIE chromaticity diagram, whose corners have the following CIE color coordinates:

a) x=0.000 and y=0.506;

b) x=0.224 and y=0.389;

c) x=0.280 and y=0.450; and d) x=0.000 and y=0.730.

In accordance with another aspect of the present invention, there is provided a method of making a blue-green light illumination system, comprising, blending a first phosphor powder having a first peak emission wavelength and a second phosphor powder having a second peak emission to form a phosphor powder mixture having emission CIE color coordinates located within an area of a pentagon on a CIE chromaticity diagram, whose corners have the following CIE color coordinates:

e) x=0.0137 and y=0.4831;

b) x=0.2240 and y=0.3890;

c) x=0.2800 and y =0.4500;

g) x=0.2879 and y=0.5196; and h) x=0.0108 and y=0.7220. and placing the phosphor powder mixture into the illumination system adjacent a radiation source.

BRIEF DESCRIPTION OF THE DRAWINGS

FIG. 5 is a table listing phosphor blend compositions according to the preferred aspects of the present invention.

DETAILED DESCRIPTION OF THE INVENTION

Figure 1:
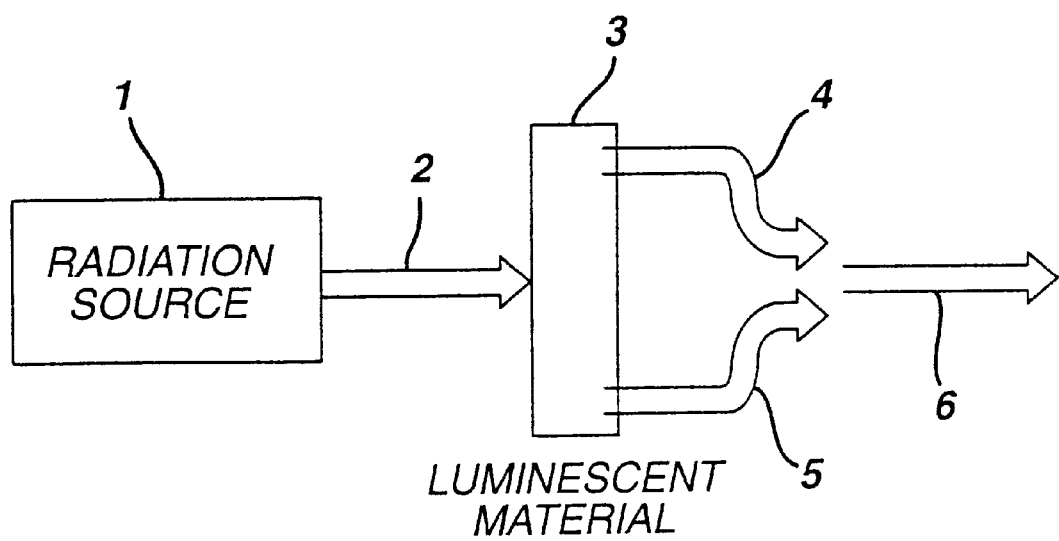
FIG. 1 is schematic illustration of a blue-green light illumination system according to one embodiment of the present invention.

The present inventors have discovered that a blue-green light illumination system that contains a luminescent material in addition to an LED is less sensitive to the undesirable variations if the blue-green light output by the system is light output by the luminescent material. In this case, the color output of the system depends only on the color output of the luminescent material. The term luminescent material preferably includes a luminescent material in loose or packed powder form (phosphor), but may also include a luminescent material in solid crystalline body form (scintillator).

The color output of a luminescent material varies much less with the composition of the luminescent material than the color output of an LED varies with the composition of the LED. Furthermore, luminescent material manufacture is less prone to material composition errors than semiconductor LED manufacturing. Therefore, out of a certain number of systems made, a higher percentage of the blue-green light illumination systems that contain a luminescent material in addition to an LED would have the desired CIE color coordinates for traffic light and other applications than a system that only contains a blue-green LED. Thus, an LED—luminescent material blue-green light illumination system has a higher manufacturing yield for traffic light or other applications than a system that only contains a blue-green LED.

The color output of the system does not vary significantly with the color output of the LED if the blue-green light emitted by the system lacks any significant visible component emitted by the LED. Therefore, the composition of the LED does not affect the color output of the system.

One way to avoid affecting the color output of the system is by using a radiation source that emits radiation at a wavelength that is not significantly visible to the human eye. For example, an LED may be constructed to emit ultraviolet (UV) radiation having a wavelength of 380 nm or less that is not visible to the human eye. Furthermore, the human eye is not very sensitive to UV radiation having a wavelength between 380 and 400 nm and to violet light having a wavelength between 400 and 420 nm. Therefore, the radiation emitted by the LED having a wavelength of 420 nm or less would not substantially affect the color output of the LED—phosphor system irrespective of whether the emitted LED radiation is transmitted through the phosphor or not, because radiation having a wavelength of about 420 nm or less is not significantly visible to a human eye.

Thus, the color of the visible light emitted by the system is solely or almost entirely dependent on the type of luminescent material used. Therefore, in order for the LED—phosphor system to emit blue-green light, the phosphor should emit blue-green light when it is irradiated by the LED radiation.

The present inventors have discovered that when at least one luminescent material, such as at least one phosphor, has at least two appropriately selected peak emission wavelengths, a human observer perceives their combined emission as blue-green light. Any luminescent materials, such as phosphors having a first peak emission wavelengths below 505 nm and a second peak emission wavelength above 505 nm may be used in combination with a radiation source to form the blue-green light illumination system. Preferably, the luminescent materials have a high quantum efficiency at a particular emission wavelength of the radiation source. Furthermore, if there is more than one luminescent material, each luminescent material preferably does not significantly absorb the visible light wavelengths emitted by the other luminescent material.

FIG. 1 schematically illustrates the above principle. In FIG. 1, a radiation source 1, such as an LED, emits radiation 2 incident on the luminescent material, such as one or more phosphors 3. The radiation 2 may have a wavelength to which the human eye is substantially not sensitive, such as 420 nm and below. Alternatively, the phosphor(s) 3 may be too thick to allow the radiation 2 to penetrate to the other side. After absorbing the incident radiation 2, the one or more phosphors 3 emits light 4 having a first peak wavelength and light 5 having a second peak emission wavelength. Light 4 and light 5 are schematically shown as coming from different portions of phosphor 3 for illustration purposes only. Light 4 and light 5 are preferably emitted from the same portions of the phosphor 3. The human observer perceives the combination of the first light 4 and the second light 5 as blue-green light 6.

In one preferred aspect of the present invention, the blue-green light 6 has emission CIE color coordinates located within an area of a quadrilateral on a CIE chromaticity diagram, whose corners have the following color coordinates:

a) x=0.000 and y=0.506;
b) x=0.224 and y=0.389;
c) x=0.280 and y=0.450; and
d) x=0.000 and y=0.730.

Figure 2:
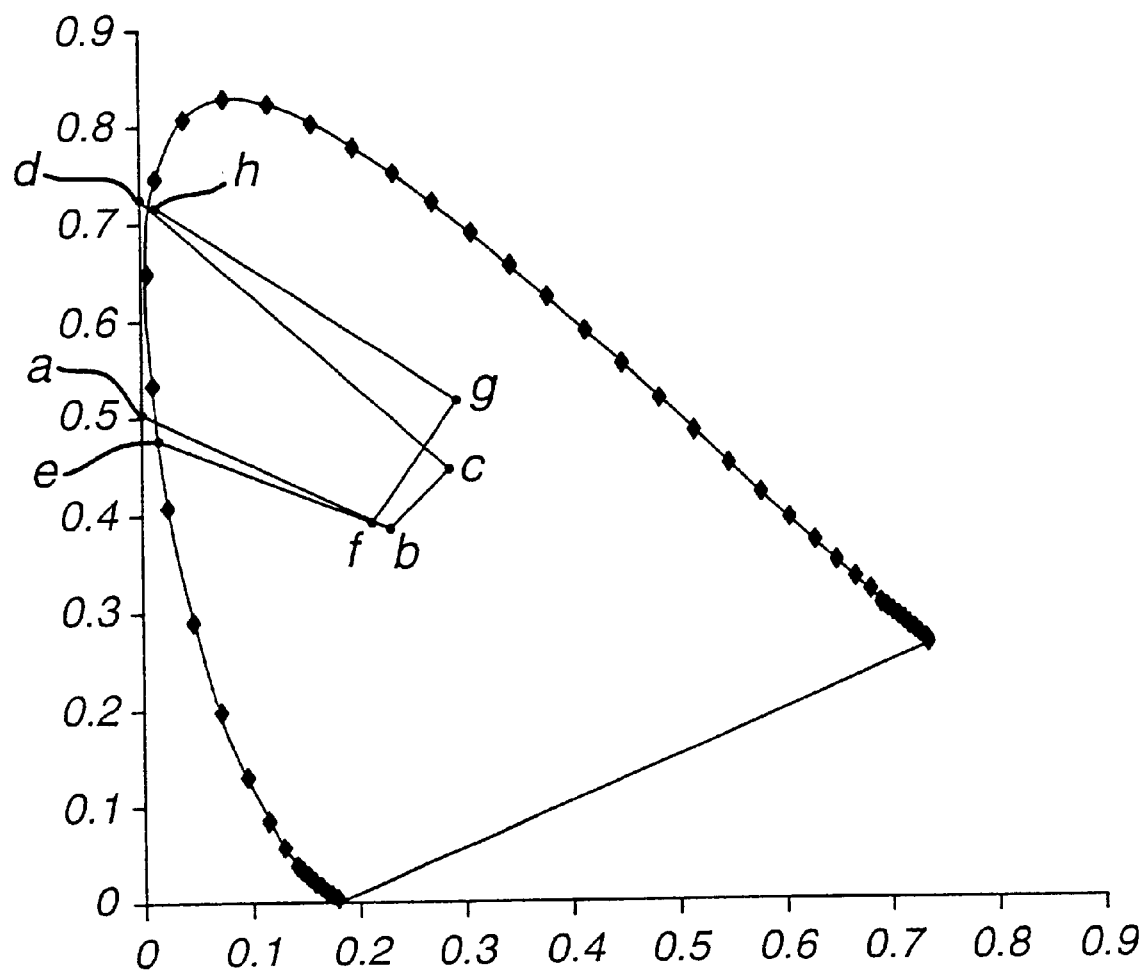
FIG. 2 is a CIE chromaticity diagram including the quadrilaterals containing the color coordinates allowed for green traffic light and green automotive display applications.

These color coordinates are particularly advantageous for green traffic light applications because they are within the ITE green traffic light bin delineated by the quadrilateral a-b-c-d illustrated in FIG. 2.

In another preferred aspect of the present invention, the blue-green light 6 has emission CIE color coordinates located within an area of a quadrilateral on a CIE chromaticity diagram, whose corners have the following color coordinates:

e) x=0.037 and y=0.4831;
f) x=0.2094 and y=0.3953;
g) x=0.2879 and y=0.5196; and
h) x=0.0108 and y=0.7220. These color coordinates are particularly advantageous for green automotive display applications because they are within the SAE green automotive display bin delineated by the quadrilateral e-f-g-h illustrated in FIG. 2. The color coordinates may be used in displays other than automotive displays, if desired.

Figure 3:
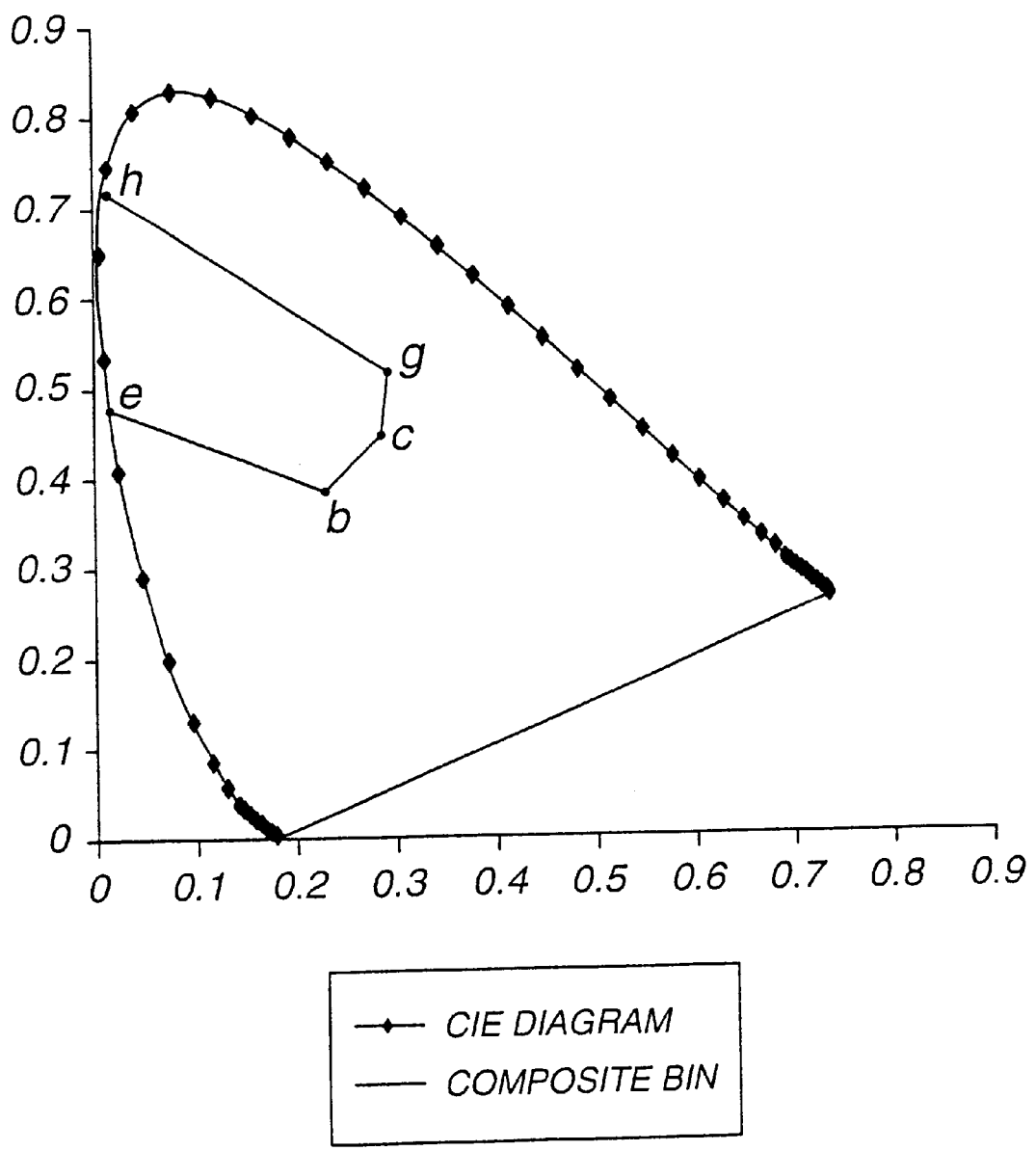
FIG. 3 is a CIE chromaticity diagram including the pentagon containing combined bin allowed for green traffic light and green automotive display applications.

In another preferred aspect of the present invention, the blue-green light 6 has emission CIE color coordinates located within an area of a pentagon on a CIE chromaticity diagram, whose corners have the following color coordinates:

e) x=0.0137 and y=0.4831;
b) x=0.2240 and y=0.3890;
c) x=0.2800 and y=0.4500;
g) x=0.2879 and y=0.5196; and
h) x=0.0108 and y=0.7220. The pentagon e-b-c-g-h is illustrated in FIG. 3. These color coordinates are advantageous for both green traffic light and automotive display applications because the area of the pentagon e-b-c-g-h includes the areas of both quadrilaterals a-b-c-d and e-f-g-h illustrated in FIG. 2. As shown in FIGS. 2 and 3, side e-h of the pentagon and the quadrilateral may be slightly bowed to follow the contour of the chromaticity curve. Preferably, the light 6 has the CIE color coordinates of $x=0.1\pm0.05$ and $y=0.52\pm0.05$.

The present inventors have discovered that a single phosphor or a combination of at least two phosphors have emission CIE color coordinates that are suitable for green traffic light and other applications. In other words, these phosphors have emission CIE color coordinates that are located inside the area of the quadrilaterals a-b-c-d or e-f-g-h in FIG. 2 and/or inside the area of the pentagon e-b-c-g-h in FIG. 3. Preferably, the color coordinates are within the range of $x=0.1\pm0.05$ and $y=0.52\pm0.05$.

1. The Single Phosphor

According to the first preferred aspect of the present invention, a single phosphor having at least two peak emission wavelengths is suitable for green traffic light applications. One single phosphor that meets the above requirements is the divalent europium and manganese activated alkaline earth metal aluminate phosphor, $AMgAlO:Eu^{2+},Mn^{2+}$, where A comprises at least one of Ba, Ca or Sr. The aluminate phosphor may have various magnesium, aluminum and oxygen molar ratios and is commercially available under the name "BAMMn." For example, one preferred BAMMn phosphor may be written as $AMg_2Al_{16}O_{27}:Eu^{2+},Mn^{2+}$, where A comprises at least 90% Ba ions, most preferably 100% Ba and Eu ions.

Alternatively, BAMMn may have the following molar ratios: $BaMgAl_{30}O_{17}: Eu^{2+}, Mn^{2+}$,.

The BAMMn phosphor has a first emission peak at about 450 nm due to the $Eu^{2+}$ activator/sensitizer on the A lattice site and a second emission peak at about 515 nm due to the $Mn^{2+}$ activator on the Mg lattice site. The strength of each peak depends on the concentration of the particular activator in the phosphor, because the 515 nm emission occurs via a nonradiative energy transfer from the $Eu^{2+}$ ions to the $Mn^{2+}$ ions. For example, at low Eu concentration and high Mn concentration, the second emission peak predominates, and the phosphor emission appears green. In contrast, at high Eu concentration and low Mn concentration, the phosphor emission appears blue. However, if the concentration of the Eu and Mn is properly balanced, the desired blue-green output, whose CIE color coordinates are located in the pentagon e-b-c-g-h in FIG. 3, may be obtained.

Figure 4:
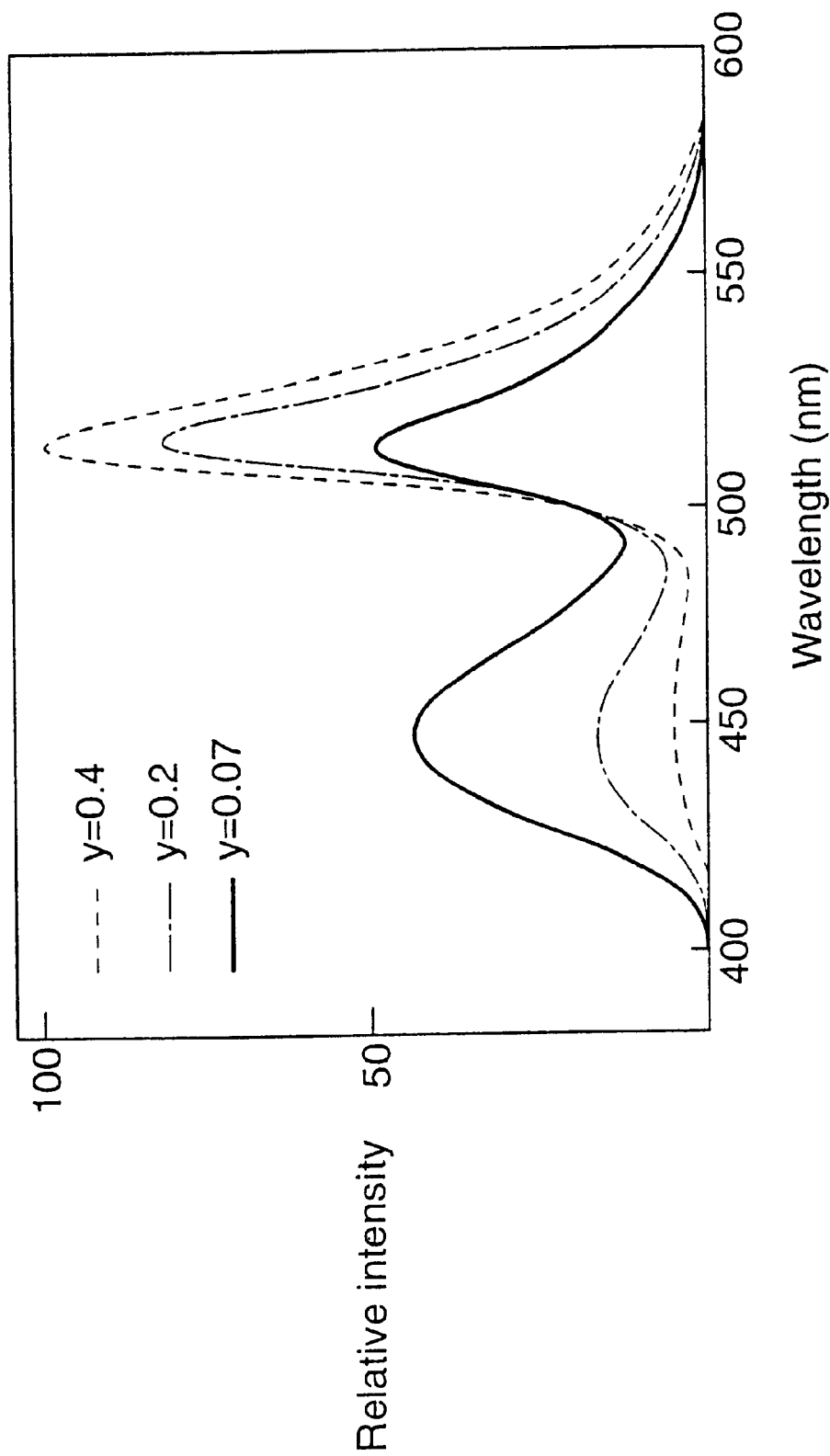
FIG. 4 is a plot of an emission spectra of a BAMMn phosphor according to one aspect of the present invention.

One example of selecting proper Eu and Mn concentrations is illustrated in FIG. 4. This figure illustrates the relative intensity of the first and second emission peaks in three phosphors in which the Mn concentration is varied while the Eu concentration and the incident radiation wavelength of 254 nm are held constant. The Eu concentration in all three $Ba_{0.8}EU_{0.2}Mg_{2-y}Mn_yAl_{16}O_{27}$ phosphors is held constant at 0.2, while the Mn concentration, y, is set to 0.07, 0.2 and 0.4 in the first, second and third phosphors, respectively. As illustrated in FIG. 4, the relative intensity of the first and second emission peaks is about the same in the first phosphor having a Mn concentration of 0.007. However, the relative intensity of the first peak at 450 nm decreases and the relative intensity of the second peak at 515 nm increases with increasing Mn concentration in the second and third phosphors.

Therefore, the relative intensity of the first and second emission peaks may be optimized to achieve the desired blue-green emission. The blue emission from the $Eu^{2+}$ activator and the green emission from the $Mn^{2+}$ co-activator can be adjusted by careful control of the $Eu^{2+}/Mn^{2+}$ concentration ratio so that the BAMMn phosphor produces the desired spectral power distribution which achieves the desired color point in the pentagon e-b-c-g-h.

While the Eu concentration is held constant in the above examples, the Eu concentration may also be varied to achieve the desired blue-green emission. Therefore, there are a plurality of combinations of Eu and Mn concentrations which will yield a phosphor having the desired blue-green emission having CIE color coordinates located in the pentagon e-b-c-g-h. Furthermore, if 1 to 10% of the barium ions are substituted with strontium ions, then the first peak shifts to longer wavelengths. Thus, the BAMMn phosphor emission color may be controlled by varying the Eu, Mn and Sr concentration to achieve the desired color coordinates. In general, the Eu concentration may vary between 0 and 0.2 and the Mn concentration may vary between 0.05 and 0.5 to achieve the desired color coordinates. The preferred BAMMn phosphor may be thus written as $Ba_{1-x}E_xMg_{2-y}Mn_yAl_{16}O_{27}$, where $0<x\leq0.2$ and $0.05\leq y\leq0.5$.

Other single phosphors that meet the above requirements are the divalent europium and manganese activated aluminate phosphors selected from an $EO*AlO:Eu^{2+},Mn^{2+}$ phosphor, an $EAlO:Eu^{2+},Mn^{2+}$ phosphor and/or a $GAlO:Eu^{2+},Mn^{2+}$ phosphor, where E comprises at least one of Ba, Sr or Ca ions and G comprises at least one of K, Li, Na or Rb ions. Preferably, E comprises Ba ions substituted with 0–10% of Sr or Ca ions and G comprises K substituted with 0–10% of Li, Na or Rb ions.

Preferably, the EO*AlO:$Eu^{2+}$,$Mn^{2+}$ phosphor comprises xBaO*$6Al_2O_3$:$Eu^{2+}$ or x($Ba_{1-x}Eu_x$)O*$6Al_{2-y}Mn_yO_3$, where $0.64 \leq x \leq 1.8$, $0 < y \leq 0.5$ and $0 < z \leq 0.2$. The EAlO:$Eu^{2+}$, $Mn^{2+}$ phosphor preferably comprises $(Ba_{1-x}Eu_x)Al_{12-y}Mn_yO_{19-0.5y}$, where $0 < x \leq 0.2$, $0 < y \leq 0.5$. The GAlO:$Eu^{2+}$, $Mn^{2+}$ phosphor preferably comprises $(K_{1-x}Eu_x)Al_{11-y}Mn_yO_{11.07-0.5y}$, where $0 < x \leq 0.2$, $0.1 \leq y \leq 0.5$.

The blue emission from the $Eu^{2+}$ activator and the green emission from the $Mn^{2+}$ co-activator can be adjusted in each aluminate phosphor by careful control of the $Eu^{2+}/Mn^{2+}$ concentration ratio in a similar way to the BAMMn phosphor so that the aluminate phosphors produce the desired spectral power distribution which achieves the desired color point in the pentagon e-b-c-g-h.

For example, for 254 nm incident radiation and a given $Eu^{2+}$ concentration of x=0.14 moles, the blue emission from the $Eu^{2+}$ activator predominates for $Mn^{2+}$ concentration below about y=0.8 moles in the EAlO:$Eu^{2+}$,$Mn^{2+}$ phosphor. However, for the same $Eu^{2+}$ concentration, the green emission from the $Mn^{2+}$ predominates for $Mn^{2+}$ concentration above about y=0.8 moles. As another example, for a given $Eu^{2+}$ concentration of x=0.14 moles, the blue emission from the $Eu^{2+}$ activator predominates for $Mn^{2+}$ concentration below about y=0.5 moles in the GAlO:$Eu^{2+}$,$Mn^{2+}$ phosphor. However, for the same $Eu^{2+}$ concentration, the green emission from the $Mn^{2+}$ predominates for $Mn^{2+}$ concentration above about y=0.5 moles. The point where the green emission from the $Mn^{2+}$ activator begins to predominate the blue emission from the $Eu^{2+}$ activator also varies with the $Eu^{2+}$ concentration and the incident radiation wavelength.

2. The Combination of Phosphors

A. The First Phosphor

According to the second preferred aspect of the present invention, a combination of at least two luminescent materials, such as phosphors, produce the desired spectral power distribution which corresponds to a color point in the pentagon e-b-c-g-h. For example, the at least one luminescent material may comprise a blend or mixture of two or more phosphors or it may comprise two or more discrete overlaying phosphors. Preferably, the first phosphor has a first peak emission wavelength below 505 nm and the second phosphor has a second peak emission wavelength above 505 nm. Most preferably, the first peak emission wavelength of the first phosphor is 440 to 455 nm and the second peak emission wavelength of the second phosphor is 510 to 525 nm. The combination of the two or more phosphors has emission CIE color coordinates that are located inside the area of pentagon e-b-c-g-h in FIG. 3 and/or are within the range of x=0.1±0.05 and y=0.52±0.05.

One example of a first phosphor having a peak emission wavelength below 505 nm is the divalent europium activated alkaline earth metal aluminate phosphor, AMgAlO:$Eu^{2+}$, where A comprises at least one of Ba, Ca or Sr. The preferred aluminate phosphor may have various magnesium, aluminum and oxygen molar ratios and is commercially available under the name "BAM." For example, one preferred BAM phosphor may be written as $AMg_2Al_{16}O_{27}$:$Eu^{2+}$, where A preferably comprises at least 90% Ba ions. This phosphor has the following formula: $(Ba_{1-x}Eu_x)Mg_2Al_{16}O_{27}$, where $0 < x \leq 0.2$, preferably x=0.07. Alternatively, BAM has the following molar ratios: $BaMgAl_{10}O_{17}$: $Eu^{2+}$. The BAM phosphor has a first emission peak at about 450 nm due to the $Eu^{2+}$ activator on the A lattice site. The first emission peak shifts from 450 nm to a higher wavelength as the amount of barium ions substituted with strontium ions increases.

Another example of a first phosphor having a peak emission wavelength below 505 nm is the divalent europium activated halophosphate phosphor, DPOCl:$Eu^{2+}$, where D comprises at least one of Sr, Ba, Ca or Mg. The DPOCl:$Eu^{2+}$ phosphor preferably comprises the commercially available "SECA" phosphor, $D_5(PO_4)_3Cl$:$Eu^{2+}$. A small amount of phosphate may be replaced by a small amount of borate to increase the emission intensity. The peak emission wavelength of this phosphor varies with the ratio of strontium to other alkaline earth ions. When D comprises only Sr ions, the peak emission wavelength is 447 nm. Substitution of the Sr ions with Ba ions cause the peak emission to shift to a lower wavelength, while substitution of the Sr ions with Ca ions cause the peak emission to shift to a higher wavelength. For example, if the 0.5 moles out of the 5 moles of Sr ions are substituted with 0.5 moles of Ca ions, then the peak emission shifts to 452 nm. If 1 mole of Sr ions are substituted with 0.5 moles of Ca ions and 0.5 moles of Ba ions, then the peak emission shifts to 445 nm. Therefore, the preferred SECA phosphor composition is $(Sr_{1-y-z}Ba_y Ca_z)_{5-x}Eu_x(PO_4)_3Cl$, where $0.01 \leq x \leq 0.2$, $0 \leq y \leq 0.1$ and $0 \leq z \leq 0.1$ and the preferred peak emission wavelength is 447–450 nm.

Other examples of a first phosphor having a peak emission wavelength below 505 nm comprise divalent europium activated aluminate phosphors selected from an EO*AlO:$Eu^{2+}$ phosphor, an EAlO:$Eu^{2+}$ phosphor and/or a GAlO:$Eu^{2+}$ phosphor, where E comprises at least one of Ba, Sr or Ca ions and G comprises at least one of K, Li, Na or Rb ions. Preferably, E comprises Ba ions substituted with 0–10% of Sr or Ca ions and G comprises K substituted with 0–10% of Li, Na or Rb ions. Preferably, the EO*AlO:$Eu^{2+}$ phosphor comprises $z(BaO)*6Al_2O_3$:$Eu^{2+}$ or $z(Ba_{1-x}Eu_x) O*6Al_2O_3$, where $1 \leq z \leq 1.8$, and $0 < x \leq 0.2$. The EAlO:$Eu^{2+}$ phosphor preferably comprises $BaAl_{12}O_{19}$:$Et^{2+}$ or $(Ba_{1-x}Eu_x)Al_{12}O_{19}$ where $0 < x \leq 0.2$. The GAlO:$Eu^{2+}$ phosphor preferably comprises $KAl_{11}O_{11.07}$:$EU^{2+}$ or $(K_{1-x}Eu_x)Al_{11}O_{11.07}$, where $0 < x \leq 0.2$.

B. The Second Phosphor

One example of a second phosphor having a peak emission wavelength above 505 nm is the divalent europium and manganese activated alkaline earth metal aluminate phosphor, AMgAlO:$Eu^{2+}$,$Mn^{2+}$ where A comprises at least one of Ba, Ca or Sr (i.e., the previously mentioned BAMMn phosphor) and where the Eu emission at about 450 nm is either absent or has a smaller relative intensity than the Mn emission at about 515 nm. The aluminate phosphor may have various aluminum to oxygen ratios, $AMg_2Al_2O_{3/2z+3}$:$Eu^{2+}$, $Mn^{2+}$ where z ranges from 14 to 40. The most preferred value of z is 16. Thus, the preferred phosphor may be written as $AMg_2Al_{16}O_{27}$:$Eu^{2+}$, $Mn^{2+}$ where A comprises at least 90% Ba ions, most preferably about 100% Ba and Eu ions.

If the BAMMn phosphor is used in combination with the BAM or SECA phosphor, then the ratio of the Eu to Mn in the BAMMn phosphor should be maintained to achieve the combined emission color coordinates that are located within the pentagon e-b-c-g-h in FIG. 3. For example, the 450 nm emission from the BAMMn phosphor may be substantially eliminated by reducing the concentration of Eu ions and/or increasing the amount of Mn ions. For example, the Mn ion concentration, y, may vary between 0.4 and 0.5. In this case, the BAMMn phosphor will emit at a substantially single peak wavelength of about 515 nm. The combination of the 450 nm peak emission from the BAM and/or SECA phosphors and the 515 nm peak emission from the BAMMn phosphor appears blue-green to the human observer. Alternatively, the BAMMn phosphor may have a sufficient Eu and Mn concentration such that the phosphor contains both the 450 Eu and the 515 Mn emission peaks. In this case, the BAM and/or SECA phosphors may be used to supplement the BAMMn 450 nm peak emission, such that the combined phosphor emission appears blue-green to the human observer.

Other examples of a second phosphor having a peak emission wavelength above 505 nm are the divalent europium and manganese activated aluminate phosphors selected from an $EO*AlO:Eu^{2+},Mn^{2+}$ phosphor, an $EAlO:Eu^{2+},Mn^{2+}$ phosphor and/or a $GAlO:Eu^{2+},Mn^{2+}$ phosphor, where E comprises at least one of Ba, Sr or Ca ions and G comprises at least one of K, Li, Na or Rb ions. Preferably, E comprises Ba ions substituted with 0–10% of Sr or Ca ions and G comprises K substituted with 0–10% of Li, Na or Rb ions.

Preferably, the $EO*AlO:Eu^{2+},Mn^{2+}$ phosphor comprises $xBaO*6Al_2O_3:Eu^{2+}, Mn^{2+}$ or $z(Ba_{1-x}Eu_x)O*6Al_{2-y}Mn_yO_3$, where $0.64 \leq z \leq 1.8$, $0.1 \leq y \leq 0.5$ and $0 < x \leq 0.2$. The $EAlO:Eu^{2+},Mn^{2+}$ phosphor preferably comprises $(Ba_{1-x}Eu_x)Al_{12-y}Mn_yO_{19-0.5y}$, where $0 < x \leq 0.2$, $0.1 \leq y \leq 0.5$. The $GAlO:Eu^{2+},Mn^{2+}$ phosphor preferably comprises $(K_{1-x}Eu_x)Al_{11-y}Mn_yO_{11.07-0.5y}$, where $0 < x \leq 0.2$, $0.1 \leq y \leq 0.5$.

Most preferably, the $xBaO*6Al_2O_3:Eu^{2+}$ phosphor comprises $Ba_{0.73}EU_{0.07}Mn_{0.20}Al_{10.9}O_{17.2}$ the $(Ba_{1-x}Eu_x)Al_{12-y}Mn_yO_{19-0.5y}$ phosphor comprises $(Ba_{0.86}Eu0.14)Al_{11.60}Mn_{0.4}O_{18.80}$, and the $(K_{1-x}Eu_x)Al_{11-y}Mn_yO_{11.07-0.5y}$ phosphor comprises $(K_{0.86}Eu_{0.14})Al_{10.80}Mn_{0.20}O_{10.97}$. The particular phosphor compositions contain a peak emission wavelength of about 515 to 520 nm. However, other ion ratios may be used if desired.

3. The Phosphor Blend

The above described first and second phosphors are advantageous because they exhibit high quantum efficiency and strong absorption at the long UV and violet wavelengths between 370 nm and 405 nm. Therefore, these phosphors are advantageous for use in a blue-green illumination system that uses an LED radiation source having a peak emission wavelength between 360 and 420 nm. However, phosphors other than those described above may be used if these phosphors contain at least two emission wavelengths whose emission CIE color coordinates are located within an area of pentagon e-b-c-g-h in FIG. 3.

In one aspect of the present invention, the BAM or the SECA and the BAMMn or the aluminate phosphors may be used together in a phosphor mixture or blend to produce the desired spectral power distribution which achieves the desired color point in the pentagon e-b-c-g-h in FIG. 3. Alternatively the above mentioned phosphors may be placed into the same illumination system as overlying layers rather than as a blend.

The phosphors may be used in any appropriate combination. The combinations may comprise the following combinations marked by "X" in FIG. 5. However, other phosphors and scintillators that have the desired emission CIE color coordinates may be used instead of or in addition to the phosphors described in FIG. 5.

In the preferred phosphor combination, the first phosphor comprises $(Ba_{1-x}Eu_x)Mg_2Al_{16}O_{27}$, where $0 < x \leq 0.2$ (BAM) and the second phosphor comprises $(Ba_{1-x}Eu_x)Mg_{2-y}Mn_yAl_{16}O_{27}$, where $0 < x \leq 0.2$ and $0 < y \leq 0.5$ (BAMMn). A phosphor blend having a BAM:BAMMn weight ratio of about 30:70 to about 8:92 may be used to achieve the color coordinates which are located in the quadrilateral a-b-c-d in FIG. 2 and/or inside the pentagon e-b-c-g-h in FIG. 3. The most preferred BAM:BAMMn weight ratio is about 18:82.

The combination of BAM and BAMMn phosphors is particularly advantageous because both phosphors are efficient down-converters of short and long wavelength ultraviolet incident radiation. The relative reflectivity of these phosphors for incident photons at various wavelengths may be readily controlled because it is mainly dependent on the $Eu^{2+}$ concentration and the phosphor particle size. Since the phosphors are chemically and structurally identical, their optical properties can also be readily tailored as described above to obtain maximum photoluminescence efficiency and absorption within a given incident radiation wavelength range. Hence, problems that are often encountered in phosphor blends, such as one phosphor strongly absorbing the luminescence emission of another in the blend and the selective absorption of the incident photons are effectively reduced or entirely circumvented in the BAM/BAMMn blend.

4. The Radiation Source

The radiation source 1 may comprise any radiation source capable of causing a blue-green emission 6 from the phosphor 3, as illustrated in FIG. 1. Preferably, the radiation source 1 comprises an LED. However, the radiation source 1 may also comprise a gas, such as mercury in a fluorescent lamp. Thus, the blue-green light illumination system may comprise a fluorescent lamp containing the blue-green emitting phosphor. These illumination systems may be used as a green light of a traffic light.

According to the first preferred embodiment of the present invention, the phosphor 3 is placed into a blue-green light illumination system containing an LED. The LED may be any LED which causes the phosphor 3 to emit blue-green radiation 6, when the radiation 2 emitted by the LED is directed onto the phosphor. Thus, the LED may comprise a semiconductor diode based on any suitable III–V, II–VI or IV—IV semiconductor layers and having an emission wavelength of 420 nm and below. For example, the LED may contain at least one semiconductor layer based on GaN, ZnSe or SiC semiconductors. The LED may also contain one or more quantum wells in the active region, if desired. Preferably, the LED active region may comprise a p-n junction comprising GaN, AlGaN and/or InGaN semiconductor layers. The p-n junction may be separated by a thin undoped InGaN layer or by one or more InGaN quantum wells. The LED may have an emission wavelength between 360 and 420 nm, preferably between 370 and 405 nm. For example the LED may have the following wavelengths: 370, 375, 380, 390 or 405 nm.

5. The Illumination System

Figure 6:
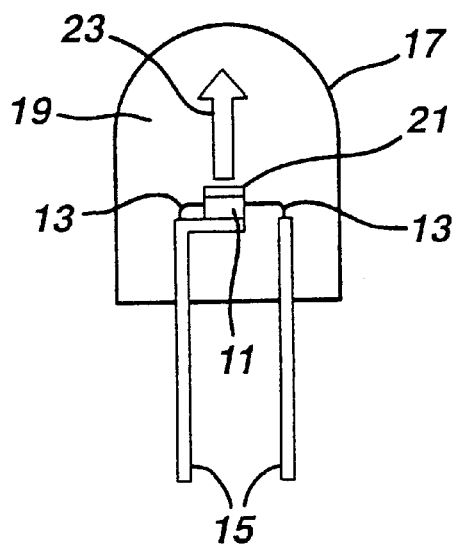
FIGS. 6–8 are cross-sectional schematic views of illumination systems using an LED according to the first preferred embodiment of the present invention.

The blue-green light illumination system according to the preferred embodiment of the present invention may have various different structures. The first preferred structure is schematically illustrated in FIG. 6. The illumination system includes a light emitting diode chip 11 and leads 13 electrically attached to the LED chip. The leads 13 may comprise thin wires supported by a thicker lead frame(s) 15 or the leads may comprise self supported electrodes and the lead frame may be omitted. The leads 13 provide current to the LED chip 11 and thus cause the LED chip 11 to emit radiation.

The LED chip 11 is encapsulated within a shell 17 which encloses the LED chip and an encapsulant material 19. The shell 17 may be, for example, glass or plastic. The encapsulant material preferably comprises a UV resistant epoxy. However, a separate shell 17 may be omitted and the outer surface of the encapsulant material 19 may comprise the shell 17. The LED chip 11 may be supported, for example, by the lead frame 15, by the self supporting electrodes, the bottom of the shell 17 or by a pedestal (not shown) mounted to the shell or to the lead frame.

The first preferred structure of the illumination system includes a phosphor layer 21 comprising the phosphor 3. The phosphor layer 21 may be formed over or directly on the light emitting surface of the LED chip 11 by coating and drying a suspension containing the phosphor powder over the LED chip 11. After drying, the phosphor powder forms a solid phosphor layer or coating 21. Both the shell 17 and the encapsulant 19 should be transparent to allow blue-green light 23 to be transmitted through those elements.

Figure 7:
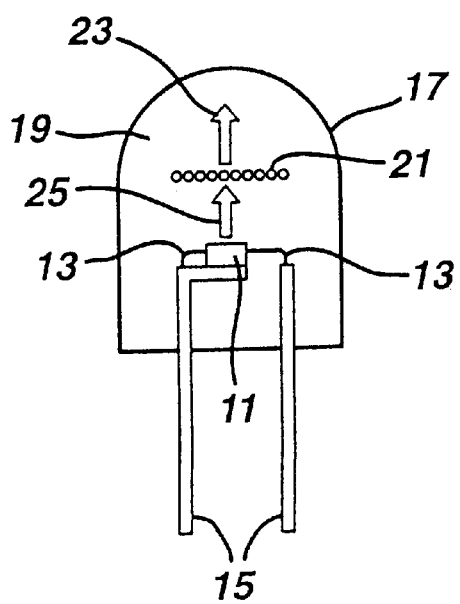

FIG. 7 illustrates a second preferred structure of the system according to the first preferred embodiment of the present invention. The structure of FIG. 7 is the same as that of FIG. 6, except that the phosphor 3 powder is interspersed within the encapsulant material 19, instead of being formed over the LED chip 11. The phosphor 3 powder may be interspersed within a single region 21 of the encapsulant material 19 or throughout the entire volume of the encapsulant material. The phosphor powder is interspersed within the encapsulant material, for example, by adding the powder to a polymer precursor, and then curing the polymer precursor to solidify the polymer material. Alternatively, the phosphor powder may be mixed in with the epoxy encapsulant. Other phosphor interspersion methods may also be used. Alternatively, a solid phosphor layer 21 comprising the phosphor 3 may be inserted into the encapsulant material 19 if desired. In this structure, the phosphor absorbs the radiation 25 emitted by the LED and in response, emits blue-green light 23.

Figure 8:
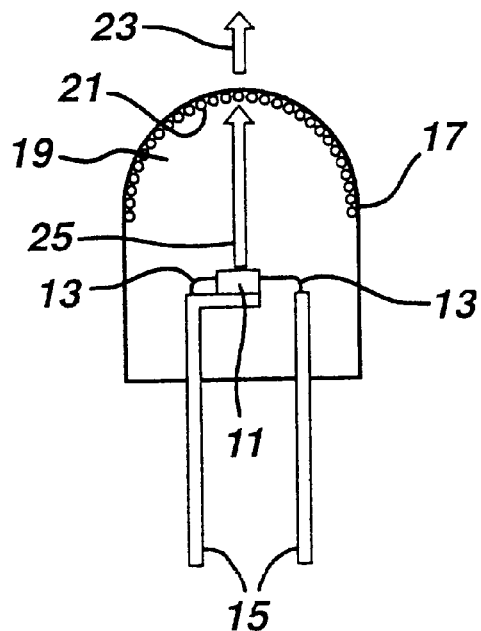

FIG. 8 illustrates a third preferred structure of the system according to the first preferred embodiment of the present invention. The structure of FIG. 8 is the same as that of FIG. 6, except that the phosphor layer 21 containing the phosphor 3 is formed on the shell 17, instead of being formed over the LED chip 11. The phosphor layer 21 is preferably formed on the inside surface of the shell 17, although the phosphor layer 21 may be formed on the outside surface of the shell, if desired. The phosphor layer 21 may be coated on the entire surface of the shell or only a top portion of the surface of the shell 17.

Of course, the embodiments of FIGS. 6–8 may be combined and the phosphor may be located in any two or all three locations or in any other suitable location, such as separately from the shell or integrated into the LED. The radiation source 1 of the illumination system has been described above as a semiconductor light emitting diode. However, the radiation source of the present invention is not limited to a semiconductor light emitting diode. For example, the radiation source may comprise a laser diode or an organic light emitting diode (OLED).

Figure 9:
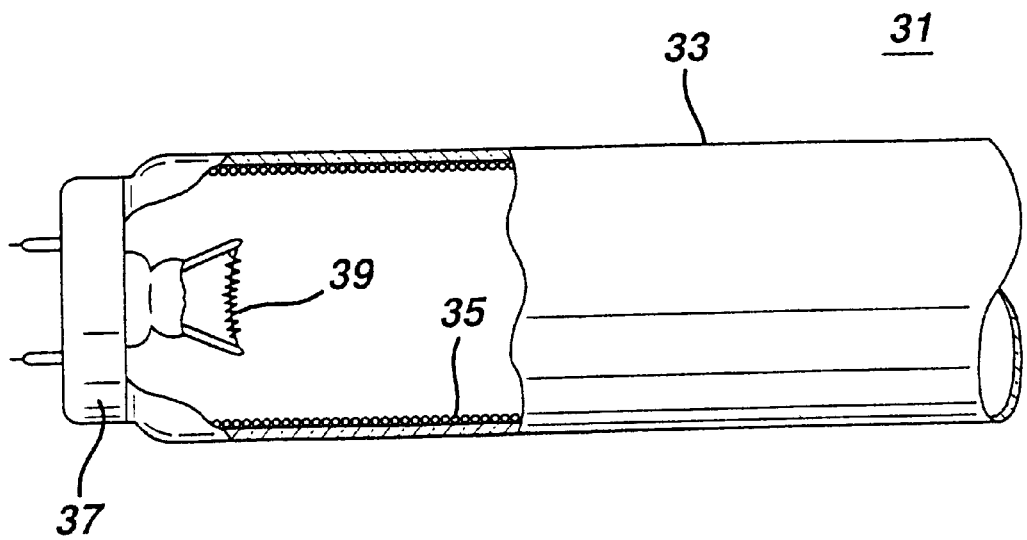
FIG. 9 is a cross-sectional schematic view of an illumination system using a fluorescent lamp according to the second preferred embodiment of the present invention.

According to the second preferred embodiment of the present invention, the phosphor 3 is placed into an illumination system containing a fluorescent lamp. A portion of a fluorescent lamp is schematically illustrated in FIG. 9. The lamp 31 contains a phosphor coating 35 comprising the phosphor 3 on a surface of the lamp cover 33, preferably the inner surface. The fluorescent lamp 31 also preferably contains a lamp base 37 and a cathode 39. The lamp cover 33 encloses a gas, such as mercury, which emits UV radiation in response to a voltage applied to the cathode 39.

Figure 10:
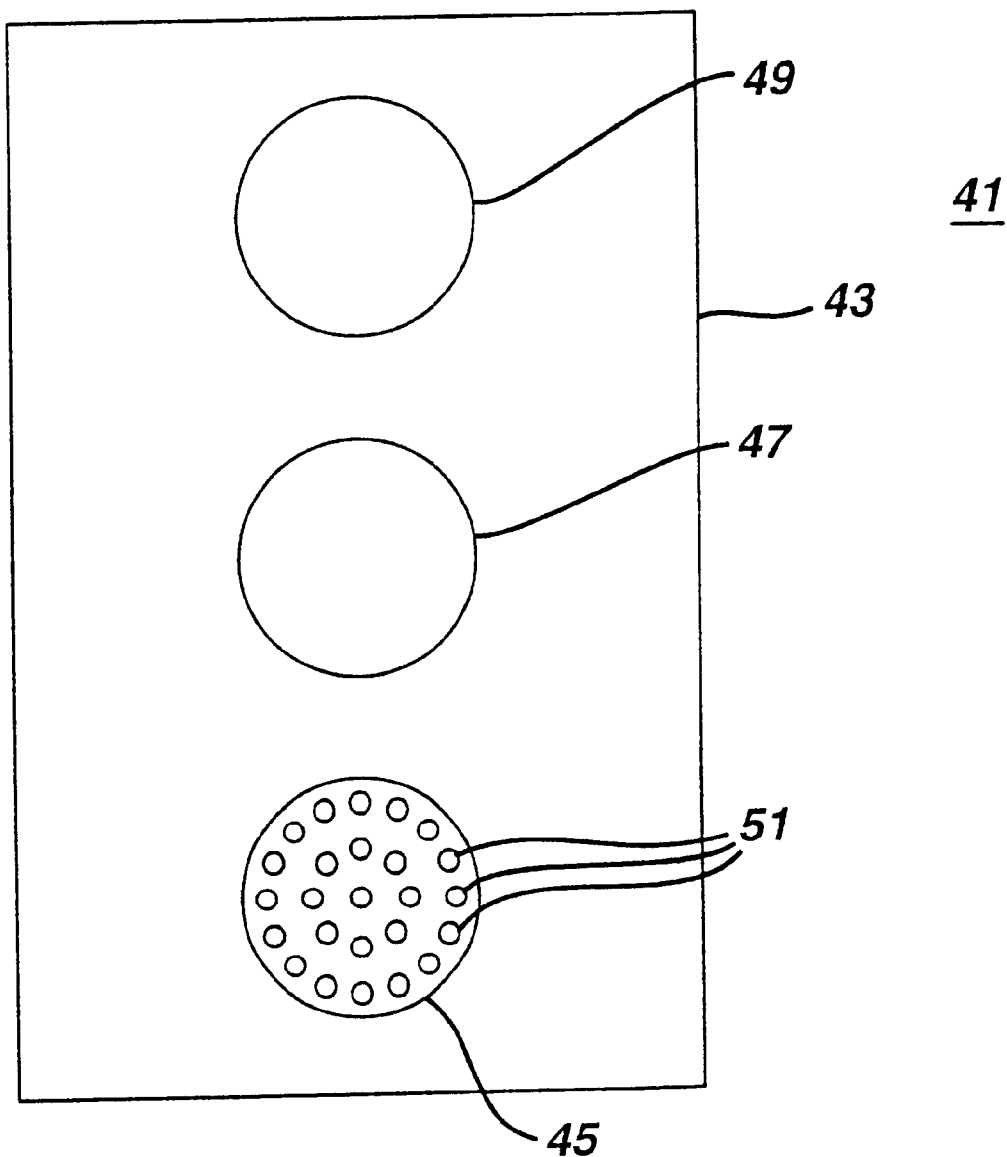
FIG. 10 is a schematic front view of a traffic signal containing the illumination systems of the preferred embodiments of the present invention as the green light.

According to the third preferred embodiment of the present invention, the illumination system comprises a traffic signal including a green traffic light which contains a plurality of the LED-phosphor or lamp-phosphor systems of the first or the second preferred embodiments as the green light source of the traffic signal. The traffic signal 41 is illustrated in FIG. 10. The traffic signal contains a base or a housing 43, which contains the light sources and the electronics which switch the individual light sources of the traffic signal on and off. A plurality of lenses are included in openings in the housing 43. Preferably, the traffic signal contains a green lens 45, a yellow lens 47 and a red lens 49. Each lens may comprise clear or colored plastic or glass. If the light source emits only one color light (i.e., green, yellow or red), then the lens may be clear. However, if the light source emits white light, then the lens should be appropriately colored.

A plurality of light sources 51 described above are arranged inside the housing 43 behind the green lens 45. Each light source 51 contains a radiation source, such as an LED 11 or fluorescent lamp 31 and a luminescent material, such as the phosphor 3. The light sources 51 may be arranged in any manner around the green lens 45 in order to provide a high blue-green light output through the lens 45. The traffic signal may contain several light sources to one hundred or more light sources, as desired. While less preferred, a single, large area light source 51 may be used instead.

According to the fourth preferred embodiment of the present invention, the illumination system comprises an automotive display which contains a plurality of the LED-phosphor systems. Preferably, the automotive display is a vehicle dashboard display, such as a clock, an odometer display or a speedometer display. The system may also be used in non-automotive displays if desired.

6. The Processing Method

A method of manufacturing the blue-green illumination system will now be described. The single phosphor or phosphor blend may be made, for example, by any ceramic powder method, such as a wet chemical method or a solid state method. For example, BAM, BAMMn and SECA are commercially available phosphors, and thus, their exact method of manufacture is not significant. Their synthesis is described on pages 398–399 and 416–419 of S. Shinoya et al., *Phosphor Handbook,* CRC Press (1987, 1999), incorporated herein by reference. The synthesis of the Eu and Mn activated EO*AlO, EAlO and GAlO phosphors is described in the following references, each incorporated herein by reference in their entirety: A. L. N. Stevels and A. D. M. Schrama-de Pauw, Journal of the Electrochemical Society, 123 (1976) 691; J. M. P. J. Verstegen, Journal of the Electrochemical Society, 121 (1974) 1623; A. L. N. Stevels and J. M. P. J. Verstegen, Journal of Luminescence, 14 (1976) 207; C. R. Ronda and B. M. J. Smets, Journal of the Electrochemical Society, 136 (1989) 570; and B. M. J. Smets and J.G. Verlijsdonk, Materials Research Bulletin, 21 (1986) 1305.

In general, a method of making a commercial BAM phosphor involves blending starting materials comprising barium carbonate, magnesium carbonate, alumina or aluminum hydroxide, europium oxide and optionally a flux, such as aluminum fluoride or barium chloride. The starting powder mixture is then fired in a reducing atmosphere at about 1200 to 1400° C. to form a calcined phosphor body or cake. The cake may be reground and refired under the same conditions. To form the BAMMn phosphor, manganese carbonate is added as an additional starting material.

A method of making a commercial SECA phosphor involves blending starting materials comprising strontium carbonate, strontium hydrogen phosphate, strontium chloride and europium oxide. The starting powder mixture is then fired in a reducing atmosphere at about 1000 to 1200° C. to form a calcined phosphor body or cake. The cake is then ground into a phosphor powder.

If the at least one luminescent material comprises a phosphor blend, then the first and second phosphor powders (such as, for example, BAM and BAMMn respectively) are blended or mixed together to form the phosphor powder blend or mixture. The powders may be manually blended in a crucible or mechanically blended in another suitable container, such as a ball mill. Of course, the phosphor powder blend may contain more than two powders, if desired. Alternatively, a first and second calcined bodies may be pulverized and blended together, if desired.

The single phosphor powder or the phosphor powder blend is then placed into the illumination system. For example, the phosphor powder or powder blend may be placed over the LED chip, interspersed into the encapsulant material or coated onto the surface of the shell, as described above with respect to the first preferred embodiment of the present invention.

If the phosphor powder or powder blend is coated onto the LED chip or the shell, then preferably, a suspension of the phosphor powder and a liquid is used to coat the LED chip or the shell surface. The suspension may also optionally contain a binder in a solvent. Preferably, the binder comprises an organic material, such as nitrocellulose or ethylcellulose, in a solvent such as butyl acetate or xylol. The binder enhances the adhesion of the powder particles to each other and to the LED or the shell. However, the binder may be omitted to simplify processing, if desired. After coating, the suspension is dried and may be heated to evaporate the binder. The phosphor powder acts as the phosphor layer 21 after drying the solvent.

If the phosphor powder or powder blend is to be interspersed within the encapsulant material 19, then the phosphor powder may be added to a polymer precursor, and then the polymer precursor may be cured to solidify the polymer material. Alternatively, the phosphor powder may be mixed in with the epoxy encapsulant. Other phosphor interspersion methods may also be used.

If the phosphor powder or powder blend is placed into a fluorescent lamp, then a suspension of the phosphor powder and a liquid is used to coat the lamp interior surface. The suspension may also optionally contain a binder in a solvent, as described above.

While one phosphor coating method has been described as a coating of a phosphor blend, the first and the second phosphors may be formed as overlying, individual layers on a surface of the illumination system. Furthermore, the luminescent material(s) may comprise single crystal scintillator material(s) instead of or in addition to the phosphors, if desired. The scintillators may be made by any scintillator fabrication method. For example, the scintillators may be formed by Czochralski, float zone, or other crystal growing methods. The scintillators may then be placed over the LED chip or used as the shell or as a top portion of the shell of the illumination system.

7. Specific Examples

The following example is merely illustrative, and should not be construed to be any sort of limitation on the scope of the claimed invention.

Six phosphor compositions comprising BAM, BAMMn or a blend of BAM and BAMMn were prepared. The BAM and BAMMn phosphor powders were commercially obtained and their exact composition and method of preparation were not disclosed by the manufacturer. The BAM/BAMMn blends were prepared by blending the commercially obtained BAM and BAMMn phosphor powders in various weight ratios to form plaques of loosely packed powder. The BAM and BAMMn compositions contained 7 molar percent Eu ions and the BAMMn compositions contained 20 molar percent Mn ions. Composition 1 contained 100% BAM and composition 6 contained 100% BAMMn. Compositions 2–5 contained 20%, 40%, 60% and 80% BAMMn, respectively. Each phosphor composition was irradiated with long wavelength 390 nm UV radiation and its emission color coordinates were derived from the emission curve. The contents of each phosphor composition and the corresponding emission color coordinates are provided in Table II below.

TABLE II

| Composition # | Contents (by weight) | x color coordinate | y color coordinate |
|---|---|---|---|
| 1 | 100% BAM | 0.1459 | 0.0925 |
| 2 | 80% BAM 20% BAMMn | 0.1449 | 0.1790 |
| 3 | 60% BAM 40% BAMMn | 0.1441 | 0.2722 |
| 4 | 40% BAM 60% BAMMn | 0.1432 | 0.3705 |
| 5 | 20% BAM 80% BAMMn | 0.1424 | 0.4966 |
| 6 | 100% BAMMn | 0.1422 | 0.6307 |

Figure 11:
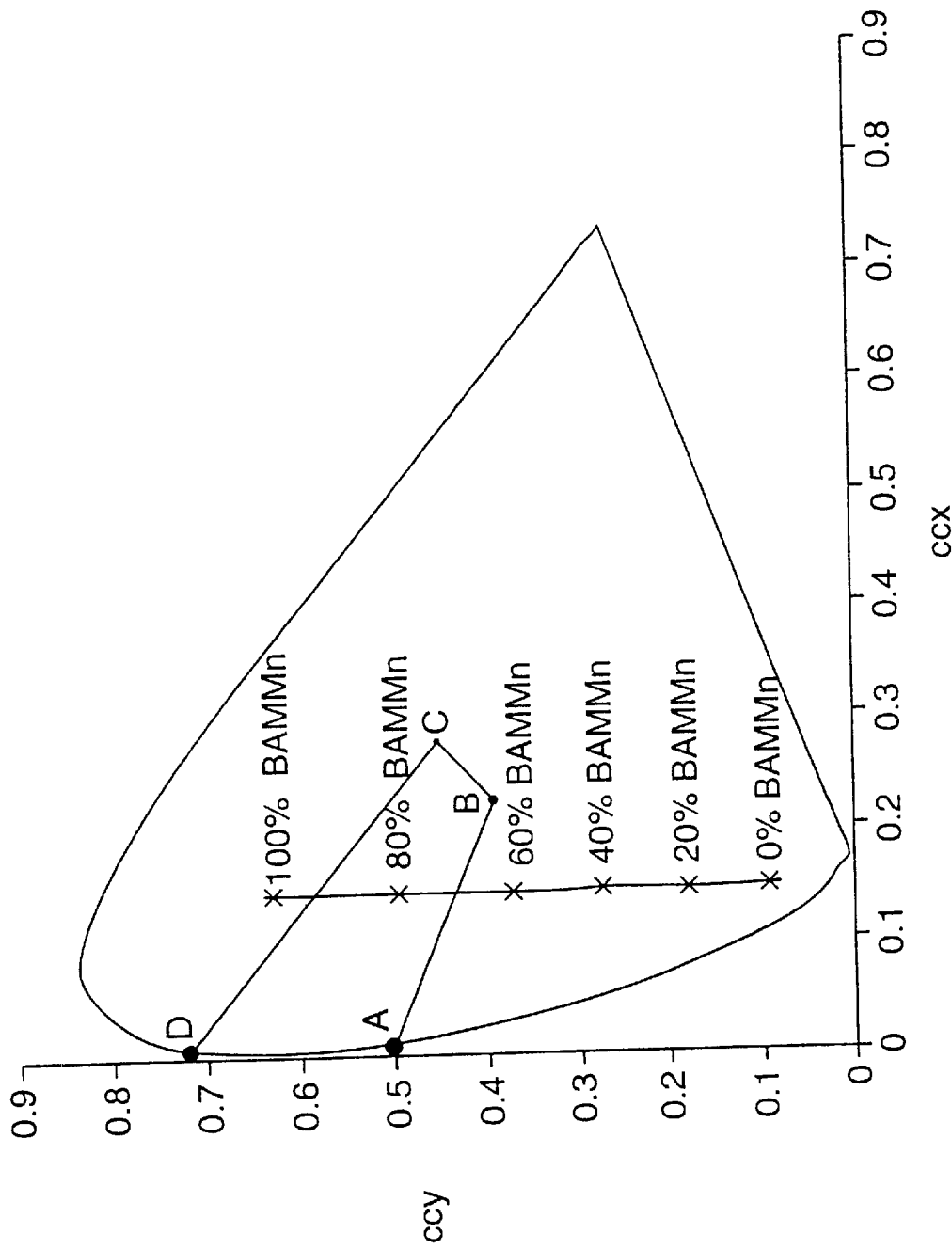
FIG. 11 is a CIE chromaticity diagram containing the color coordinates of various BAM/BAMMn phosphor blends.

The color coordinates of compositions 1–6 are graphically represented on the CIE chromaticity diagram in FIG. 11. As shown in FIG. 11, it is possible to obtain a variety of BAM/BAMMn phosphor blends which have emission color coordinates within the quadrilateral a-b-c-d and/or the pentagon e-b-c-g-h. Therefore, a variety of BAM/BAMMn phosphor blends are suitable for green traffic light applications. It was established that BAM/BAMMn phosphor blend may have a BAM:BAMMn weight ratio of about 30:70 to about 8:92 in order to obtain color points located inside quadrilateral a-b-c-d and/or pentagon e-b-c-g-h. The most preferred BAM:BAMMn weight ratio in the blend is about 18:82. Thus, it is possible to obtain similar chromaticity coordinates to those of the InGaN LED of the prior art by using a phosphor containing illumination system.

The weight ratios of other phosphor blends listed in Table II, above, may likewise be optimized in order to obtain color points located in the pentagon e-b-c-g-h in FIG. 3 or quadrilateral a-b-c-d in FIG. 11. The preferred aspects of the present invention are advantageous because they provide the ability to exercise considerable control over the energy distribution of the emitted photon (and hence the color coordinates) and provide equivalent or higher brightness over the direct conversion of electric power to visible light by the InGaN LED of the prior art.

The preferred embodiments have been set forth herein for the purpose of illustration. However, this description should not be deemed to be a limitation on the scope of the invention. Accordingly, various modifications, adaptations, and alternatives may occur to one skilled in the art without departing from the spirit and scope of the claimed inventive concept.

What is claimed is:

1. A blue-green illumination system, comprising:
   a light emitting diode; and
   at least one luminescent material having at least two peak emission wavelengths, wherein emission CIE color coordinates of the at least two peak emission wavelengths are located within an area of a pentagon on a CIE chromaticity diagram, (whose corners have the following CIE color coordinates:

e) x=0.0137 and y=0.4831;
b) x=0.2240 and y=0.3890;
c) x=0.2800 and y=0.4500;
g) x=0.2879 and y=0.5196; and
h) x =0.0108 and y =0.7220.

2. The system of claim 1, wherein:
the light emitted by the system lacks any significant visible component emitted by the light emitting diode.

3. The system of claim 2, wherein the light emitting diode peak emission wavelength is between 360 and 420 nm.

4. The system of claim 3, wherein the light emitting diode contains an InGaN active layer having a peak emission wavelength between 370 and 405 nm.

5. The system of claim 4, wherein the luminescent material emission CIE color coordinates are x=0.1±0.05 and y=0.52±0.05.

6. The system of claim 1, wherein the emission CIE color coordinates of the at least one luminescent material are located within an area of a quadrilateral on a CIE chromaticity diagram, whose corners have the following CIE color coordinates:

a) x=0.000 and y=0.506;
b) x=0.224 and y=0.389;
c) x=0.280 and y =0.450; and
d) x=0.000 and y=0.730.

7. The system of claim 1, wherein the emission CIE color coordinates of the at least one luminescent material are located within an area of a quadrilateral on a CIE chromaticity diagram, whose corners have the following CIE color coordinates:

e) x=0.0137 and y=0.4831;
f) x=0.2094 and y=0.3953;
g) x=0.2879 and y=0.5196; and
h) x=0.0108 and y=0.7220.

8. The system of claim 1, wherein:
the at least one luminescent material comprises a single $AMgAlO:Eu^{2+},Mn^{2+}$ phosphor; and
A comprises at least one of Ba, Ca or Sr.

9. The system of claim 8, wherein:
the $AMgAlO:Eu^{2+},Mn^{2+}$ phosphor comprises an $AMg_2Al_{16}O_{27}:Eu^{2+},Mn^{2+}$ phosphor; and
A comprises at least 90% Ba.

10. The system of claim 9, wherein:
the $AMg_2Al_{16}O_{27}:Eu^{2+}, Mn^{2+}$ phosphor comprises a $Ba_{1-x}Eu_xMg_{2-y}Mn_yAl_{16}O_{27}$ phosphor;
0<x≤0.2; and
0.05≤y≤0.5.

11. The system of claim 1, wherein:
the at least one luminescent material comprises a single phosphor selected from:
i) an $EO*AlO:Eu^{2+},Mn^{2+}$ phosphor, where E comprises at least one of Ba, Sr or Ca;
ii) an $EAlO:Eu^{2+},Mn^{2+}$ phosphor, where E comprises at least one of Ba, Sr or Ca; or
iii) a $GAlO:Eu^{2+},Mn^{2+}$ phosphor, where G comprises at least one of K, Li, Na or Rb.

12. The system of claim 11, wherein:
the $EO*AlO:Eu^{2+},Mn^{2+}$ phosphor comprises $xBaO*6Al_2O_3:Eu^{2+},Mn^{2+}$;

the $EAlO:Eu^{2+},Mn^{2+}$ phosphor comprises $(Ba_{1-x}Eu_x)Al_{12-y}Mn_yO_{19-0.5y}$;
the $GAlO:Eu^{2+},Mn^{2+}$ phosphor comprises $(K_{1-x}Eu_x)Al_{11-y}Mn_yO_{11.07-0.5y}$.

13. The system of claim 1, wherein:
the at least one luminescent material comprises a first phosphor having a first peak emission wavelength below 505 nm and a second phosphor having a second peak emission wavelength above 505 nm.

14. The system of claim 13, wherein the first peak emission wavelength is in a range from 440 to 455 nm and the second peak emission wavelength is in a range from 510 to 525 nm.

15. The system of claim 14, wherein the first phosphor comprises at least one of:

a) an $AMgAlO:Eu^{2+}$ phosphor where A comprises at least one of Ba, Ca or Sr;
b) a $DPOCl:Eu^{2+}$ phosphor where D comprises at least one of Sr, Ba, Ca or Mg;
c) an $EO*AlO:Eu^{2+}$ phosphor, where E comprises at least one of Ba, Sr or Ca;
d) an $EAlO:Eu^{2+}$ phosphor, where E comprises at least one of Ba, Sr or Ca; or
e) a $GAlO:Eu^{2+}$ phosphor, where G comprises at least one of K, Li, Na or Rb.

16. The system of claim 15, wherein the second phosphor comprises at least one of:

f) an $AMgAlO:Eu^{2+},Mn^{2+}$ phosphor where A comprises at least one of Ba, Ca or Sr;
g) an $EO*AlO:Eu^{2+},Mn^{2+}$ phosphor, where E comprises at least one of Ba, Sr or Ca;
h) an $EAlO:Eu^{2+},Mn^{2+}$ phosphor, where E comprises at least one of Ba, Sr or Ca; or
i) a $GAlO:Eu^{2+},Mn^{2+}$ phosphor, where G comprises at least one of K, Li, Na or Rb.

17. The system of claim 15, wherein:
the $AMgAlO:Eu^{2+}$ phosphor comprises $AMg_2Al_{16}O_{27}:Eu^{2+}$, where A comprises at least 90% Ba;
the $DPOCl:Eu^{2+}$ phosphor comprises $(Sr,Ba,Ca,Mg)_5(PO_4)_3Cl:Eu^{2+}$;
the $AMgAlO:Eu^{2+},Mn^{2+}$ phosphor comprises $AMg_2Al_{16}O_{27}:Eu^{2+},Mn^{2+}$, where A comprises at least 90% Ba;
the $EO*AlO:Eu^{2+}$ phosphor comprises $xBaO*6Al_2O_3:EU^{2+}$;
the $EAlO:Eu^{2+}$ phosphor comprises $(Ba_{1-x}Eu_x)Al_{12}O_{19}$; and
the $GAlO:Eu^{2+}$ phosphor comprises $(K_{1-x}Eu_x)Al_{11}O_{11.07}$;
the $EO*AlO:Eu^{2+},Mn^{2+}$ phosphor comprises $xBaO*6Al_2O_3:Eu^{2+},Mn^{2+}$;
the $EAlO:Eu^{2+},Mn^{2+}$ phosphor comprises $(Ba_{1-x}Eu_x)Al_{12-y}Mn_yO_{19-0.5y}$; and
the $GAlO:Eu^{2+},Mn^{2+}$ phosphor comprises $(K_{1-x}Eu_x)Al_{11-y}Mn_yO_{11.06-0.5y}$.

18. The system of claim 17, wherein:
the $AMg_2Al_{16}O_{27}:Eu^{2+}$ phosphor comprises $(Ba_{1-x}Eu_x)Mg_2Al_{16}O_{27}$, where 0<x≤0.2;
the $(Sr,Ba,Ca,Mg)_5(PO_4)_3Cl:Eu^{2+}$; phosphor comprises $(Sr_{1-y-z} Ba_y Ca_z)_{5-x}Eu_x (PO_4)_3Cl$, where 0.01≤x≤0.2, 0≤y≤0.1 and 0≤z≤0.1.
the $AMg_2Al_{16}O_{27}:Eu^{2+}$ phosphor comprises $(Ba_{1-x}Eu_x)Mg_{2-y}Mn_yAl_{16}O_{27}$, where 0<x≤0.2 and 0<y≤0.5;

the $xBaO*6Al_2O_3:Eu^{2+}$ phosphor comprises $Ba_{0.73}EU_{0.07}Mn_{0.20}Al_{10.9}O_{17.2}$;

the $(Ba_{1-x}Eu_x)Al_{12-y}Mn_yO_{19-0.5y}$ phosphor comprises $(Ba_{0.86}EU_{0.14})Al_{11.60}Mn_{0.40}O_{18.80}$; and the $(K_{1-x}Eu_x)Al_{11-y}Mn_yO_{11.06-0.5y}$ phosphor comprises $(K_{0.86}Eu_{0.14})Al_{10.80}Mn_{0.20}O_{10.97}$.

19. The system of claim 18, wherein:

the first phosphor comprises $(Ba_{1-x}Eu_x)Mg_2Al_{16}O_{27}$, where $0<x\leq0.2$; and the second phosphor comprises $(Ba_{1-x}Eu_x)Mg_{2-y}Mn_yAl_{16}O_{27}$, where $0<x\leq0.2$ and $0<y\leq0.5$.

20. The system of claim 19, wherein the at least one luminescent material comprises the first phosphor and the second phosphor in a weight ratio of about 30:70 to about 8:92.

21. The system of claim 20, wherein the weight ratio of the first phosphor to the second phosphor is about 18:82.

22. The system of claim 21, wherein:

the first phosphor and the second phosphor are interspersed; or the first phosphor and the second phosphor comprise discrete overlying layers.

23. The system of claim 13, wherein at least one of the first phosphor or the second phosphor comprises a blend of at least two phosphors.

24. The system of claim 1, further comprising:

a shell containing the light emitting diode;

an encapsulating material between the shell and the light emitting diode;

wherein at least one luminescent material comprises at least one phosphor, and a) the phosphor is coated over a surface of the light emitting diode;

b) the phosphor is interspersed in the encapsulating material; or c) the phosphor is coated onto the shell.

25. The system of claim 24, further comprising:

a traffic signal housing containing the blue-green illumination system; and a traffic light lens in front of the blue-green illumination system.

26. The system of claim 1, wherein radiation emitted from a $Eu^{2+}$ activator results in a first peak emission wavelength and radiation emitted from a $Mn^{2+}$ activator results in a second peak emission wavelength.

27. A traffic signal, comprising:

a housing;

at least one lens;

a radiation source having a peak emission wavelength of 420 nm and below; and at least one luminescent material having at least two peak emission wavelengths, wherein emission CIE color coordinates of the at least two peak emission wavelengths are located within an area of a quadrilateral on a CIE chromaticity diagram, whose corners have the following CIE color coordinates:

a) x=0.000 and y=0.506;

b) x=0.224 and y=0.389;

c) x=0.280 and y=0.450; and d) x=0.000 and y=0.730.

28. The traffic signal of claim 27, wherein the radiation source comprises a light emitting diode.

29. The traffic signal of claim 28, wherein the emission CIE color coordinates of the at least two peak emission wavelengths are x=0.1±0.05 and y=0.52±0.05.

30. The traffic signal of claim 29, wherein the at least one luminescent material comprises a blend of a $(Ba_{1-x}Eu_x)Mg_2Al_{16}O_{27}$ phosphor, where $0<x\leq0.2$, and a $(Ba_{1-x}Eu_x)Mg_{2-y}Mn_yAl_{16}O_{27}$ phosphor, where $0<x\leq0.2$ and $0<y\leq0.5$ in a weight ratio of about 30:70 to about 8:92.

31. The traffic signal of claim 30, wherein the weight ratio is about 18:82.

32. A method of making a blue-green light illumination system, comprising:

blending a first phosphor powder having a first peak emission wavelength and a second phosphor powder having a second peak emission wavelength to form a phosphor powder mixture having emission CIE color coordinates located within an area of a pentagon on a CIE chromaticity diagram, whose corners have the following CIE color coordinates:

e) x=0.0137 and y=0.4831;

b) x=0.2240 and y=0.3890;

c) x=0.2800 and y=0.4500;

g) x=0.2879 and y=0.5196; and h) x=0.0108 and y=0.7220; and placing the phosphor powder mixture into the illumination system adjacent a radiation source.

33. The method of claim 32, wherein the radiation source comprises a light emitting diode.

34. The method of claim 33, wherein:

the light emitting diode peak emission wavelength is between 370 and 405 nm; and the phosphor powder mixture emission CIE color coordinates are x=0.1±0.05 and y=0.52±0.05.

35. The method of claim 34, wherein the step of blending comprises blending a first phosphor powder selected from at least one of:

a) a $AMgAlO:Eu^{2+}$ phosphor where A comprises at least one of Ba, Ca or Sr; or b) a $DPOCl:Eu^{2+}$ phosphor where D comprises at least one of Sr, Ba, Ca or Mg; and a second phosphor powder selected from at least one of:

c) a $AMgAlO:Eu^{2+},Mn^{2+}$ phosphor where A comprises at least one of Ba, Ca or Sr;

d) an $EaO*AlO:Eu^{2+},Mn^{2+}$ phosphor, where E comprises at least one of Ba, Sr or Ca;

e) an $EAlO:Eu^{2+},Mn^{2+}$ phosphor, where E comprises at least one of Ba, Sr or Ca; or f) a $GAlO:Eu^{2+},Mn^{2+}$ phosphor, where G comprises at least one of K, Li, Na or Rb.

36. The method of claim 35, wherein the step of blending the first phosphor powder and the second phosphor powder comprises blending $(Ba_{1-x}Eu_x)Mg_2Al_{16}O_{27}$, where $0<x\leq0.2$, and $(Ba_{1-x}Eu_x)Mg_{2-y}Mn_yAl_{16}O_{27}$, where $0<x\leq0.2$ and $0<y\leq0.5$ in a weight ratio of about 30:70 to about 8:92.

37. The method of claim 36, wherein the weight ratio is about 18:82.

38. The method of claim 33, further comprising:

placing the light emitting diode into a shell; and filling the shell with an encapsulating material.

39. The method of claim 38, further comprising:

a) coating a suspension of the phosphor powder mixture and a solvent over a surface of the light emitting diode and drying the suspension;

b) interspersing the phosphor powder mixture in the encapsulating material; or c) coating a suspension of phosphor powder mixture and a solvent onto the shell and drying the suspension.

40. The method of claim 32, wherein the emission CIE color coordinates of the phosphor powder mixture are located within an area of a quadrilateral on a CIE chromaticity diagram, whose corners have the following CIE color coordinates:

a) x=0.000 and y=0.506;

b) x=0.224 and y=0.389;

c) x=0.280 and y=0.450; and d) x=0.000 and y=0.730.

41. The method of claim 40, further comprising placing the illumination system into a traffic signal housing.

42. The method claim 32, wherein the emission CIE color coordinates of the phosphor powder mixture are located within an area of a quadrilateral on a CIE chromaticity diagram, whose corners have the following CIE color coordinates:

e) x=0.0137 and y=0.4831;

f) x=0.2094 and y=0.3953;

g) x=0.2879 and y=0.5196; and h) x=0.0108 and y=0.7220.

43. The method of claim 42, further comprising placing the illumination system into an automotive display.

* * * * *

UNITED STATES PATENT AND TRADEMARK OFFICE
CERTIFICATE OF CORRECTION

PATENT NO.     : 6,466,135 B1
DATED          : October 15, 2002
INVENTOR(S)    : Alok Mani Srivastava et al.

It is certified that error appears in the above-identified patent and that said Letters Patent is hereby corrected as shown below:

<u>Column 1,</u>
Please insert the following heading and paragraph immediately following the title and before the heading "BACKGROUND OF THE INVENTION":

-- STATEMENT REGARDING FEDERALLY SPONSORED RESEARCH OR DEVELOPMENT

The U.S. Government may have certain rights in this invention pursuant to grant number 70NANB8H4022 from the NIST. --

Signed and Sealed this

Fourth Day of March, 2003

JAMES E. ROGAN
*Director of the United States Patent and Trademark Office*